US007904869B2

(12) United States Patent
Yu et al.

(10) Patent No.: US 7,904,869 B2
(45) Date of Patent: Mar. 8, 2011

(54) METHOD OF AREA COMPACTION FOR INTEGRATED CIRCUIT LAYOUT DESIGN

(75) Inventors: Kathleen C. Yu, Austin, TX (US); Scott D. Hector, Austin, TX (US); Robert L. Maziasz, Austin, TX (US); Claudia A. Stanley, Austin, TX (US); James E. Vasck, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 387 days.

(21) Appl. No.: 11/958,605

(22) Filed: Dec. 18, 2007

(65) Prior Publication Data

US 2009/0158229 A1 Jun. 18, 2009

(51) Int. Cl.
*G06F 9/455* (2006.01)

(52) U.S. Cl. ......... 716/132; 716/110; 716/118; 716/119; 716/123

(58) Field of Classification Search .................. 716/1–3, 716/8–11, 19–21
See application file for complete search history.

(56) References Cited

U.S. PATENT DOCUMENTS

| | | | |
|---|---|---|---|
| 5,309,371 A * | 5/1994 | Shikata et al. .................. 716/10 |
| 5,481,472 A | 1/1996 | Chung et al. |
| 6,067,409 A | 5/2000 | Scepanovic et al. |
| 6,099,580 A | 8/2000 | Boyle et al. |
| 6,286,128 B1 | 9/2001 | Pileggi et al. |
| 6,407,434 B1 | 6/2002 | Rostoker et al. |
| 6,442,743 B1 | 8/2002 | Sarrafzadeh et al. |
| 6,961,916 B2 | 11/2005 | Sarrafzadeh et al. |
| 6,961,936 B2 | 11/2005 | Bhatti |
| 7,126,837 B1 * | 10/2006 | Banachowicz et al. ......... 365/63 |
| 7,155,693 B1 * | 12/2006 | Rodman .......................... 716/8 |
| 7,277,309 B1 * | 10/2007 | Banachowicz et al. .... 365/49.11 |
| 7,308,667 B2 * | 12/2007 | Katagiri ........................... 716/8 |
| 2004/0037474 A1 | 2/2004 | Happel |
| 2006/0041851 A1 | 2/2006 | Gallatin et al. |
| 2006/0112355 A1 | 5/2006 | Pileggi et al. |

OTHER PUBLICATIONS

U.S. Appl. No. 11/423,240, filed Jun. 9, 2006.
U.S. Appl. No. 11/366,286, filed Mar. 2, 2006.

* cited by examiner

*Primary Examiner* — Nghia M Doan
(74) *Attorney, Agent, or Firm* — Kim-Marie Vo; Michael J. Balconi-Lamica (57) ABSTRACT

A method of area compaction for integrated circuit layout design comprises determining physical extent boundaries for each layer of at least first circuit and second circuit building blocks. Determining physical extent boundaries includes determining for each respective layer of the first circuit and second circuit building blocks (i) a used portion and (ii) a free portion. The used portion corresponds to a functional portion of the respective circuit building block and the free portion corresponds to a non-functional portion of the respective circuit building block. The method further includes establishing packing keys with respect to the determined physical extent boundaries of each layer of the first circuit and second circuit building blocks, respectively. The packing keys define an interlocking characteristic for packing compaction of the corresponding first circuit or second circuit building block with another circuit building block.

14 Claims, 4 Drawing Sheets

METHOD OF AREA COMPACTION FOR INTEGRATED CIRCUIT LAYOUT DESIGN

BACKGROUND

1. Field

This disclosure relates generally to the layout of an integrated circuit, and more specifically, to the design of logic blocks in an integrated circuit.

2. Related Art

As semiconductor devices decrease in size, the effects of the variability in process performance increase. Therefore, there is a desire to make design layouts of the semiconductor devices more regular to decrease sensitivity to process variability. However, such methods undesirably increase the semiconductor device size. This increases area costs by decreasing the number the die that can be manufactured on the wafer. In addition, yield may be reduced because the area affected by a random defect is greater for larger devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Blocks, corresponding to circuitry for an integrated circuit layout design, include various levels (e.g., a gate level and metal layers). The blocks have different boundaries at different layers. This results in blocks of irregular shapes. Due to their irregular shapes, the blocks can be interlocked to decrease the combined area of the blocks. Furthermore, tiles or other features or blocks can be added to fill voids or create a regular shaped block, such as a rectangle.

Figure 1:
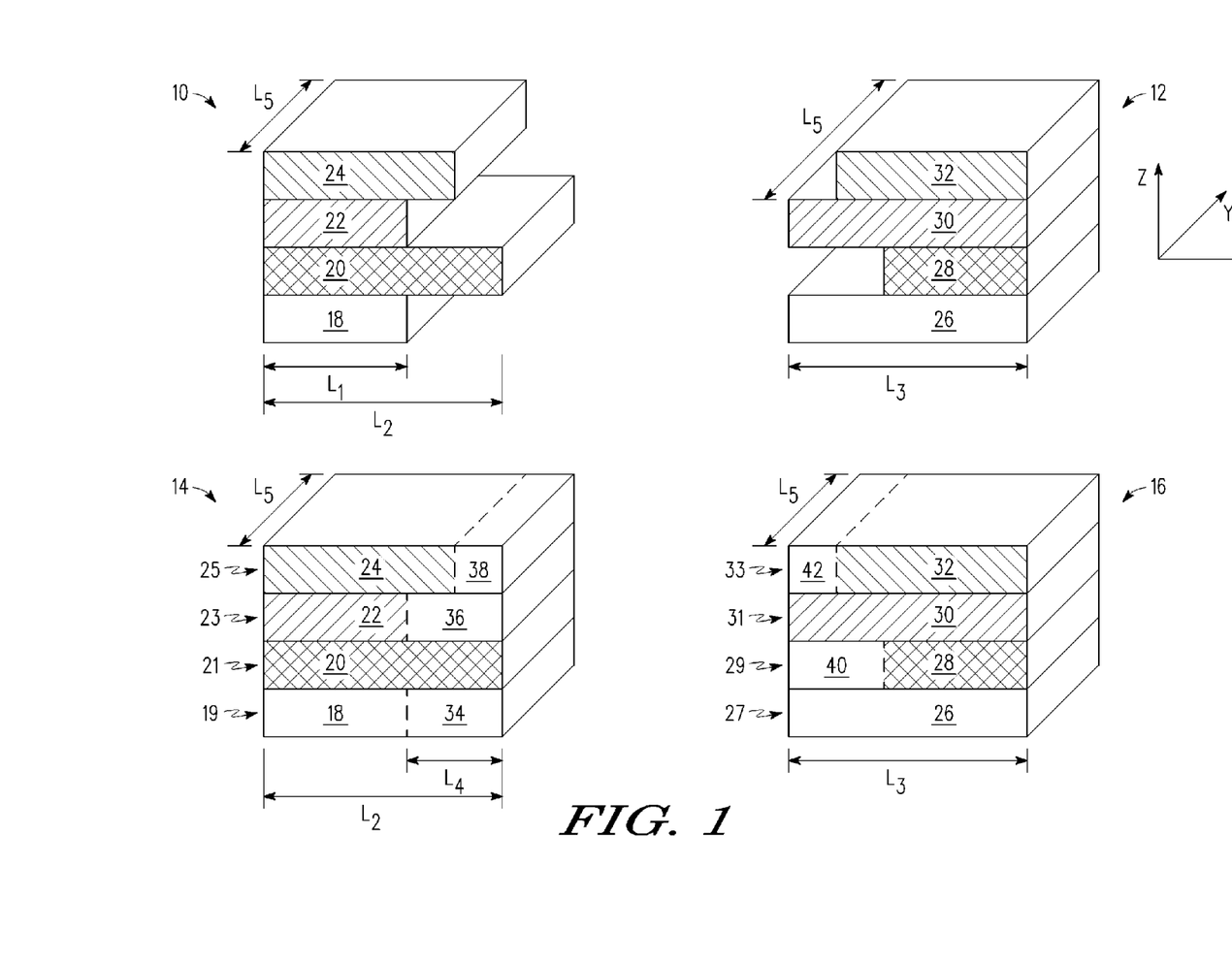
FIG. 1 illustrates blocks used in accordance with an embodiment and prior art blocks.

FIG. 1 illustrates blocks used in accordance with one embodiment and also prior art blocks. As shown by the axis, FIG. 1 illustrates the x-z plane if the blocks. All the blocks 10, 12, 14, and 16 have a fifth length in the y-direction, which is denoted as L5. Blocks 10 and 12 are used in accordance with one embodiment, and blocks 14 and 16 are prior art blocks. Block 10 includes a first used section 18, a second used section 20 formed over the first used section 18, a third used section 22 formed over the second used section 20, and a fourth used section 24 formed over the third used section 22. Each of the used sections 18, 20, 22, and 24 have various lengths (some of the lengths may or may not be equal to each other.) In the embodiment illustrated, the first used section 18 has a first length L1 and the second used section 20 has a second length L2, which is greater than the first length. The block 12 includes a first used section 26, a second used section 28, third used section 30, and a fourth used section 32. The first used section 26 has a third length, L3. Each used section is a layer in a circuitry design that includes at least one feature. For example, the used section could be a gate layer or a metal layer of a cell, such as a NAND cell. The gate layer may be formed from polysilicon, metal, the like, or combinations of the above. For example, first used sections 18 and 26 may be the features of a gate layer, second used sections 20 and 28 may be the features of a first metal layer, third used sections 22 and 30 may be the features of second metal layer, and fourth used sections 24 and 32 may be the features of a third metal layer.

The prior art blocks 14 and 16 also include the used sections 18, 20, 22, 24, 26, 28, 30, and 32 but they also include free spaces 34, 36, 38, 40, and 42. A first layer 19 includes the first used section 18 and a first free space 34, which has a fourth length, L4. The first layer 19 has the second length, L2, which is the sum of the first used section 18 (L1) and the length of the first free space 34 (L4). A second layer 21 includes only the used space 20. Similar to the first layer 19, the third layer 23 includes the third used section 22 and the second free space 36 and the third layer 23 has the second length, L2. Also similar to the first layer 19 and the third layer 23, the fourth layer 25 includes the fourth used section 24 and the fourth free space 38 and the fourth layer 25 has the second length, L2. Each layer in the prior art blocks 14 has a length equal to the second length, L2. This is because the prior art determines the longest length of a layer and then extends the boundaries of the block for each layer to the longest length. In contrast, in block 10, each layer has a different length. The benefit of this will be appreciated after further discussion.

Similar to the prior art block 14, the boundaries or length of each layer of the prior art block 16 is the same. Hence, all layers in the block 16 are the third length, L3. Thus, the boundaries of the prior art block 16 is defined by the edge of the layer that extends the farthest. (Due to connectivity between the layers, one layer cannot be moved relative to the other to line up edges.) Thus, like the prior art block 14, the prior art block 16 includes free space, that is wasted space on the die. In blocks 10 and 12 the free space is used to contain layout features with electrical functionality. Block 16 includes a first layer 27 that includes first used section 26. The block 16 also includes a second layer 29 that includes second used section 28 and first free space 40. The block 16 includes a third layer 31 that includes third used section 30. Within the third length L3, there is no free space on third layer 31. The block 16 also includes a fourth layer 33 that includes third free space 42 and fourth used section 32. Blocks 14 and 16 have plan-view area values equal to L2×L5 and L3×L5, respectively.

In the prior art, when the prior art blocks 14 and 16 are placed next to each other the interface between the two blocks 14 and 16 is a flat surface. Hence, there is free space remaining in the layers. (When the two blocks 14 and 16 are placed together, the first layers 19 and 27 may become a combined first layer, the second layers 21 and 29 may become a combined second layer, the third layers 23 and 31 may become a combined third layer, and the fourth layers 25 and 33 may become a combined fourth layer.) The open space in each layer does not include any electrical functionality, but undesirably increases the size of the block and hence, the resulting semiconductor device.

In contrast, when the blocks 10 and 12 are combined the blocks may be interleaved resulting in some layers (used sections) of the blocks overlapping layers (used sections) in the adjoining block. In the example illustrated, a portion of the used section 24 will overlap a portion of the used section 30. Similarly, a portion of the used section 30 will overlap the used section 20 and a portion of the used section 20 will overlap the used section 26. When the blocks 10 and 12 are combined, the total length of the combination is L1+L3. In contrast, when the prior art blocks 14 and 16 are combined, the total length is L2+L3. Since L2 is greater than L1 (by L4) the combination of the blocks 10 and 12 results in a combined block or cluster that has a plan view area less than the plan view area of the combined prior art blocks 14 and 16 by an amount L4×L5. When combining the blocks 10 and 12 the edges of adjacent used sections may be in contact with each other. However, to prevent shorting the edges may not be in contact with each other if they are different nets.

Figure 2:
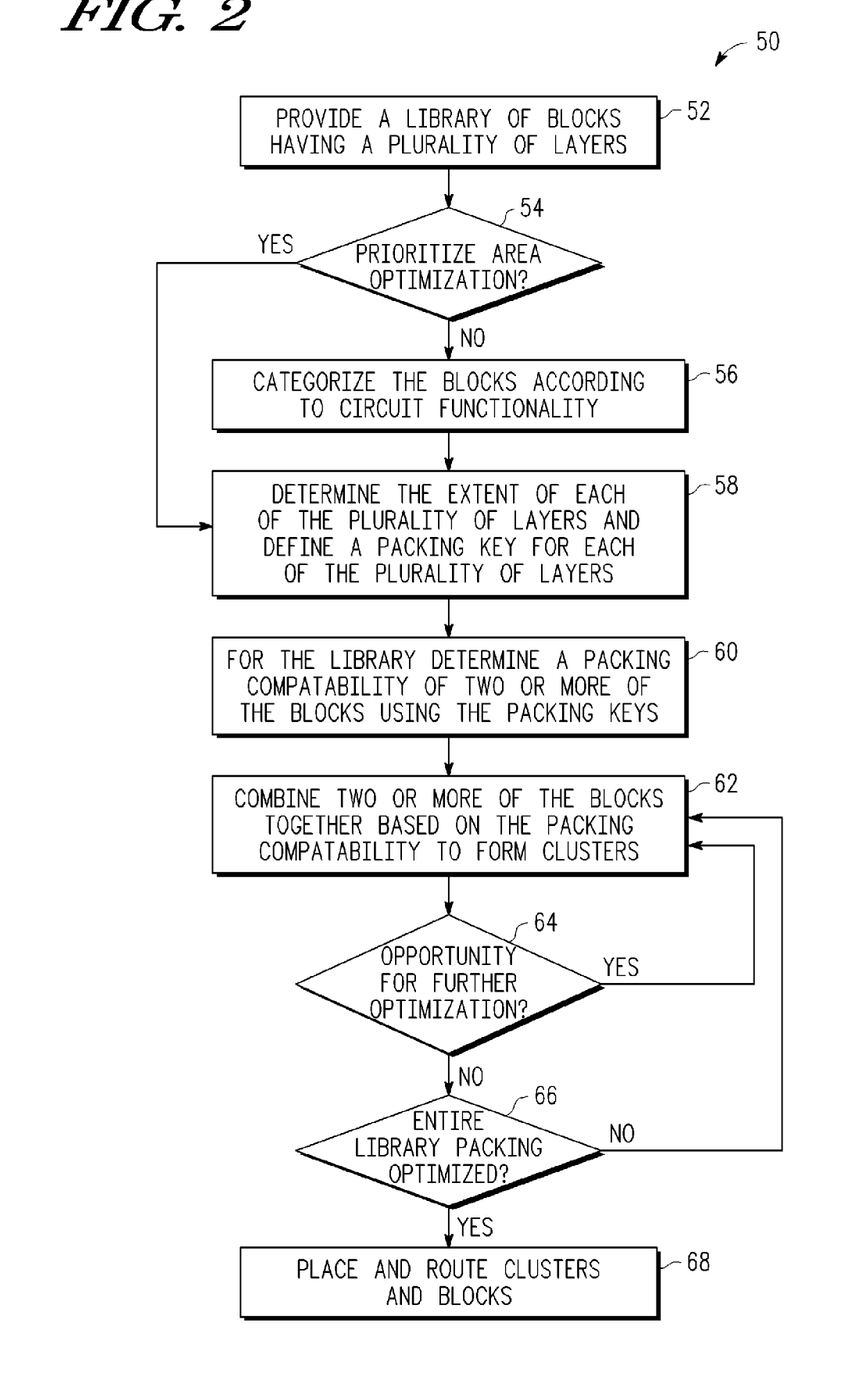
FIG. 2 illustrates a method used to form clusters in accordance with an embodiment.

FIG. 2 illustrates a method 50 in accordance with an embodiment that may be used to combine the blocks 10 and 12. A library of blocks having a plurality of layers is provided in step 52. The blocks, for example, can be standard cells, such as NAND, NOR, exclusive OR, logic functions, the like, or combinations of the above. There may be any number of blocks, such as tens to thousands. In decision diamond 54, the question as to whether area optimization is to be prioritized is asked. In one embodiment, it may be desirable to prioritize speed optimization of the device being designed instead of area optimization. In one embodiment, the library blocks may include simple library elements that are formed together to make up a library block after compaction. The method of compaction of these simple library elements can be the same, similar or different than the method 50. In one embodiment, the simple library elements are pre-defined primitive elements that are parts of a functional device, such as a transistor. The edges of the primitives are tagged such that only the intended abutment possibilities are allowed. The primitives are combined to form complete functional devices, such as transistors. An automated place and route or manually process can be used to combine the primitives to form the simple library elements.

If it is not desirable to prioritize the area optimization, then the blocks are categorized according to circuit functionality in step 56. Thus, from the library of blocks, various blocks are may be organized together to form a logic function, such as a state machine, that may be used repeatedly in the circuitry being formed. This categorization can be performed manually for a small number of blocks. In another embodiment, it can be formed by analyzing the netlist of the circuit and forming groups of blocks that are within several node connections of each other. The netlist is formed from a circuit diagram.

After providing the library of blocks 52 (if the answer to decision diamond 54 is yes) or after categorizing the blocks in step 56 (if the answer to decision diamond 54 is no), the (physical) extent of each of the plurality of layers is determined and a packing key for each of the plurality of layers is defined in step 58. In one embodiment, determining the extent of each of the plurality of layers includes determining for each layer (i) a used portion and (ii) a free portion, the used portion corresponding to a functional portion of the first circuit building block and the free portion corresponding to a non-functional portion of the first circuit building block. In one embodiment determining the extent includes analyzing a block inter terms of area usage for at least one FEOL (front end of line) device layer or at least one BEOL ((back end of line) routing layer. In one embodiment, a software tool, such as a physical verification tool, determines the extent or length of each of the layers in a block. Hence, for the block 10, the length or edge of the first used section 18, the second used section 20, the third used section 22, and the fourth used section 24 is determined. Next, a packing key is defined for each layer. The packing key may be assigned for each layer or may be assigned for each edge of the layer. In one embodiment, the packing key may be a set of numbers. In one embodiment, if a predetermined number is larger for one layer or free space than another, the larger number may indicate that the layer extends farther than the layer or free space with the smaller number or vice versa. In addition, the packing key could be a picture, any other symbol, character, binary or hexadecimal number or combination of the above (including a number). A packing key could also be a dynamic characteristic of a layer or block, and take on values or states dependent on the type of circuit being created, circuit assembly rules, or other design and manufacturing criteria.

After step 58, in step 60 a packing compatibility of two or more of the blocks is determined using the packing keys. This is performed for all the blocks in the library. The packing compatibility can be determined by comparing the packing keys. For example, in one embodiment, a packing key description for one layer may be +1, meaning the layer extends a distance of 1 unit farther than a reference layer, and a complementary packing key may be −1, meaning the layer recedes a distance of 1 unit less than the reference layer. In this embodiment, the packing compatibility can be 0, the sum of the two packing keys, indicating 100% or full compatibility. In another embodiment, a computer algorithm may be used to analyze the degree of interlock of each block to each other block in the library of blocks needed to create the design in question. The degree of interlock may be determined using a graphical routine to fit the blocks as tightly together as possible like would be done for assembling a puzzle. The result is a table of the degree of interlock, or packing compatibility number, for each block with respect to each other block.

After step 60, two or more of the blocks are combined together based on the packing compatibility to form clusters. In one embodiment, a pair of blocks is joined based on a desirable packing compatibility. In one embodiment, a block is chosen to be combined with another block with which its packing compatibility is lowest in number. In one embodiment, instead of starting with one block and looking for another block that it is most compatible with, one can combine the blocks from the beginning by trying to minimize the packaging compatibility of all the blocks with each other. In this embodiment, two blocks that are fully compatible may not be combined if it causes other blocks to be combined so that there is little packaging compatibility (e.g., a large number).

As will be appreciated after further discussion, in step 62, two blocks (or more) can be combined with one or more blocks because step 62 may be repeated. If more than one block is combined with one or more blocks, the one or more blocks can be combined with another block or cluster based on the packing compatibility between blocks that are available to be combined.

After combining the blocks in step 62, in decision diamond 64 it is determined if there is an opportunity for further optimization. In one embodiment, this decision can be made by determining if the sum of the packing compatibility of the blocks that are joined together is less than a predetermined number. If the sum of the packing compatibility is greater than a predetermined number then further optimization is needed so that the answer to the decision diamond 64 is yes and step 62 is repeated. If the sum of the packing compatibilities of the blocks joined together is less than a predetermined number, then further optimization is not needed so the answer to the decision diamond 64 is no and the method 50 proceeds to decision diamond 66.

After the answer to decision diamond 64 is no, then in decision diamond 66 the question is asked if the entire library packing is optimized. If the entire library is not optimized for packing then step 62 is repeated. In one embodiment, a computer algorithm such as simulated annealing may be used to find the lowest total packing compatibility value for the blocks in a given circuit design. If the entire library is optimized then step 68 is performed. In step 68, the clusters and any blocks that were not joined to other blocks or clusters, if any, are placed and routed using conventional software. The conventional software will try to minimize the area of the design. By having already tried to decrease the area of the clusters prior to step 68, the area will be further reduced in step 68, if possible.

Figure 3:
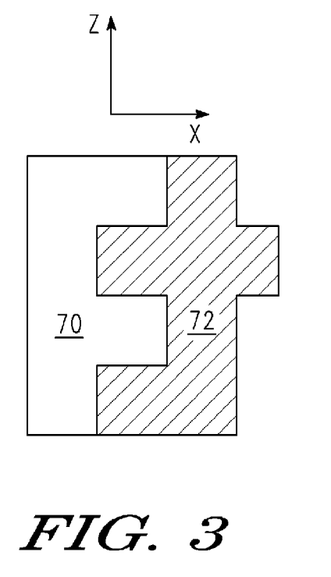
FIG. 3 illustrates a cluster in accordance with an embodiment.

FIG. 3 illustrates a cluster of two blocks in the x-z plane that in one embodiment results from step 62. Block 70 is interlocked with block 72. In other words, blocks 70 and 72 have an interlocking boundary. Since edges of the blocks 70 and 72 overlap (or in other words the blocks 70 and 72 are in contact with each other), the packaging coplanarity of the two blocks 70 and 72 is optimal. In one embodiment, this 100% compatibility can be defined as a 1.

Figure 4:
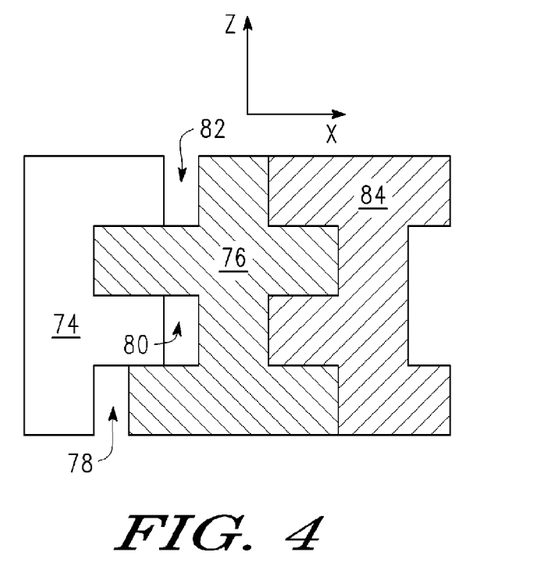
FIG. 4 illustrates a cluster in accordance with another embodiment.

FIG. 4 illustrates a cluster of three blocks in the x-z plane in accordance with one embodiment Blocks 76 and 84 are 100% compatible, but blocks 74 and 76 are less than 100% or less than optimally compatible. Instead, gaps 78, 80, and 82 exist so that the blocks 74 and 76 are not completely interlocked. However, the blocks 74 and 76 are interlocked because portions of blocks 74 extend into the outermost boundary of block 76. The outermost boundary of block 76 is determined by taking the farthest extending portion of block 76 and drawing a horizontal or vertical line (whichever is appropriate so that the line does not intersect the block 76) so as to form a rectangle around the block; this rectangle is the outermost boundary 76. In other words the outermost boundary is defined by the farthest extending point in the x and z directions. While the interlocking between blocks 74 and 76 is not optimal, the interlocking may be sufficient. The combined area of blocks 74 and 76 even with the sub-optimal interlocking is less than the area of blocks 74 and 76 if there was no interlocking. Hence, any amount of interlocking decreases the area of the blocks as compared to no interlocking. Furthermore, if blocks 74 and 76 did not have the irregular shapes and instead were made to be rectangles having the outermost boundary as each rectangle's perimeter, the combined area of the blocks would be even greater than that shown in FIG. 4. Thus, even if the interlocking is not optimal, the combined area of the blocks is reduced. In one embodiment, the interlocking of blocks 74 and 76 can be given an interlocking value between 0 and 1, such as 0.5.

Figure 5:
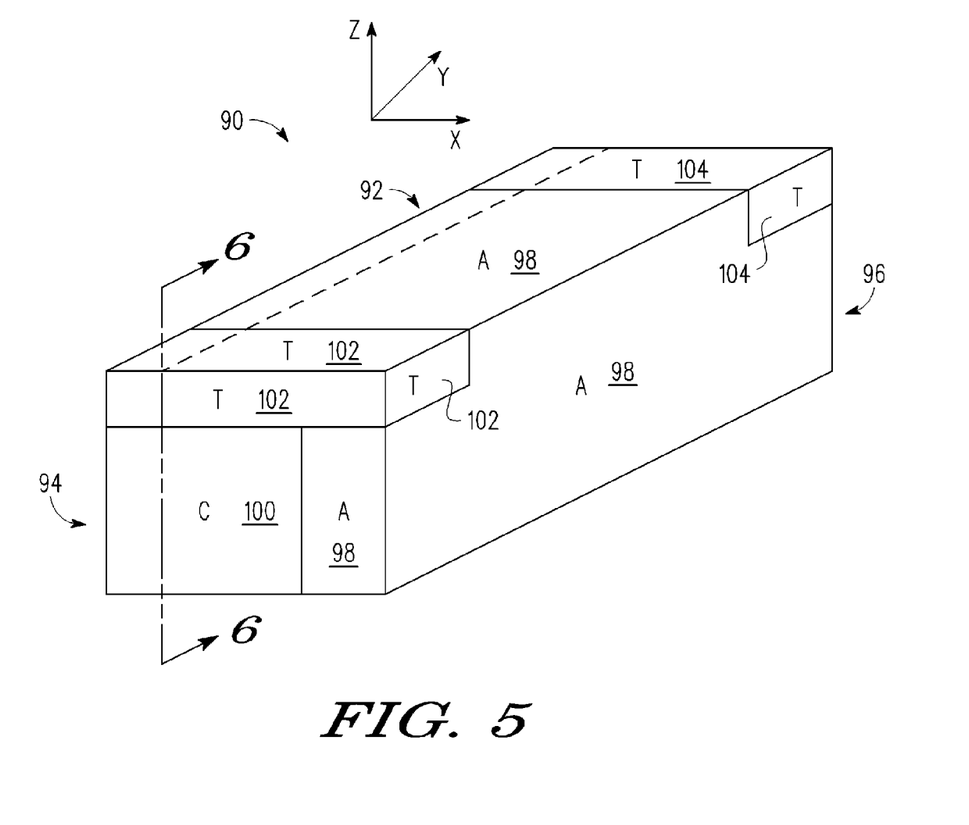
FIG. 5 illustrates a three-dimensional view of a cluster in accordance with an embodiment.

FIG. 5 illustrates a three-dimensional view of a cluster 90 in accordance with an embodiment. The cluster 90 has a top surface 92. On the top surface 92 block A 98 and tiles 102 and 104 are exposed. The cluster has a side surface 96 on which the tiles 104 and 102 and the block A 98 are also exposed. The cluster also has a side surface 94 on which the tile 102, block C and the block A are exposed. Other blocks (such as block B), tiles, or the like may be present in the cluster 90, and may be exposed on sides not visible in FIG. 5 or may not be visible on any side of the cluster 90 (i.e., it may be surrounded by blocks, tiles, or other features). By varying the size and shape of the blocks, tiles, and other features in the cluster 90 packing efficiency and smaller die sizes may be achieved. In addition, patterning, stress control, metal height/width uniformity, and low dielectric constant damage regions may be improved. In one embodiment, the flow in FIG. 2 may be used to form the cluster 90. In some embodiments, tiles 102 and 104 may be added to improve process uniformity or to have the cluster 90 have a predetermined size or shape. In contrast to the prior art, the tiles 102 and 104 are not added after circuitry layout. Instead, the tiles 102 and 104 may be added during creation of the cluster 90. In one embodiment, the tiles are 102 or 104 fill voids that were created when combining the blocks. In one embodiment, the cluster 90 is a rectangle so that the cluster 90 can be repeated throughout the design layout. A rectangle is one shape that is suitable because its sides are flat so it can be combined easily with itself and other shapes that have a flat surface. However, other suitable shapes having regular patterns may be used In one embodiment, when blocks are placed and routed into a 3-dimensional integrated circuit design, as illustrated in FIG. 5 the block may be quantized. In one embodiment, quantizing the 3-dimensional integrated circuit design involves restricting the length of the blocks, either alone or after combined together, in the 3-dimensional integrated circuit design for optimal packing efficiency.

Figure 6:
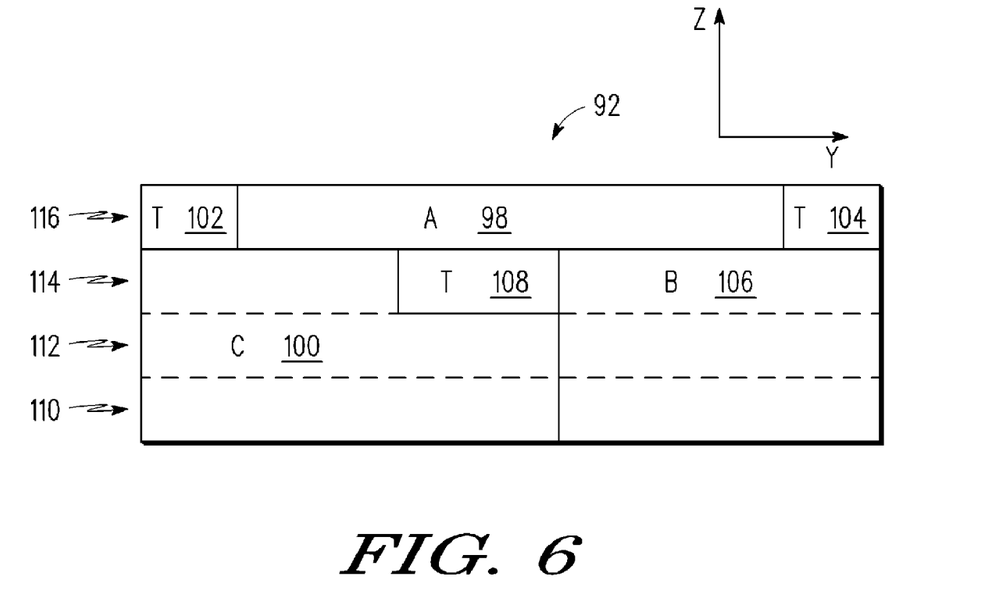
FIG. 6 illustrates a cross-section of the FIG. 5 in the y-z axis in accordance with an embodiment.

FIG. 6 is a cross-section of the cluster 90 of FIG. 5 in the y-z axis. The cross-section includes portions of the block C 100, block B 106, tiles 102,104 and 108, and block A 98. (Block B 106 and tile 108 were not exposed in the cluster 90 illustrated in FIG. 5.) Layers 110, 112,114, and 116 illustrate the layers of the circuit design. In one embodiment, layer 110 is a gate layer, such as a polysilicon gate layer, and layers 112, 114, and 116 are metal layers, which may be referred to as metal 1 (first metal layer), metal 2 (second metal layer), and metal 3 (third metal layer), respectively. For example, the portion of blocks B and C 100, 106 at the cross-section have three layers: gate layer 110, and metal layers 112 and 114. The portion of the tile 108 at the cross-section is only present in the metal layer 114. In one embodiment, the tile 108 is only present in the metal layer 114. The portions of block A 98 and tiles 102 and 104 at the cross-section are only in the metal layer 116. The cross-section illustrated in FIG. 6 combines a portion of a design that has a third metal layer (i.e., block A 98) with a portion of a design that does not have a third metal layer (i.e., blocks C and B 100 and 106). Thus, cluster 90 may combine BEOL and FEOL intensive design portions to form a compact cluster so that the area of the designs is decreased when the cluster is formed.

Below are descriptions of some embodiments:

1. A method of area compaction for integrated circuit layout design comprising:
   determining physical extent boundaries for each layer of a first circuit building block; and
   establishing a packing key with respect to the determined physical extent boundaries of each layer of the first circuit building block, wherein the packing key defines an interlocking characteristic for packing compaction with another circuit building block.
2. The method of item 1, wherein determining physical extent boundaries includes determining for each layer of the first circuit building block (i) a used portion and (ii) a free portion, the used portion corresponding to a functional portion of the first circuit building block and the free portion corresponding to a non-functional portion of the first circuit building block.
3. The method of item 2, wherein the functional portion comprises a portion functionally used by the first circuit building block and the non-functional portion comprises a portion not functionally used by the first circuit building block.
4. The method of item 1, wherein determining physical extent boundaries includes determining for each layer of the first circuit building block (i) an area for active usage by the first circuit building block and (ii) an area free of active usage.

5. The method of item 1, wherein determining physical extent boundaries includes analyzing a first circuit building block in terms of area usage for a characteristic selected from the group consisting of (i) at least one FEOL device layer and (ii) at least one BEOL routing layer of the first circuit building block.

6. The method of item 1, wherein the interlocking characteristic of the packing key includes a non-rectangular shape in cross-section for use in a packing compaction.

7. The method of item 1, further comprising:
 determining physical extent boundaries for each layer of a second circuit building block; and
 establishing a second packing key with respect to the determined physical extent boundaries of each layer of the second circuit building block, wherein the second packing key defines an interlocking characteristic for packing compaction with the first circuit building block or another circuit building block.

8. The method of item 7, wherein determining physical extent boundaries includes analyzing the second circuit building block in terms of area usage for a characteristic selected from the group consisting of (i) at least one FEOL device layer and (ii) at least one BEOL routing layer of the second circuit building block.

9. The method of item 7, further comprising:
 determining packing compatibilities of one or more pairs of circuit building blocks of a library of circuit building blocks, wherein the packing compatibility for a given pair of circuit building blocks is determined according to respective packing keys of each circuit building block of the given pair of circuit building blocks.

10. The method of item 9, further comprising:
 forming clusters between two or more of the first circuit building block, the second circuit building block, and another circuit building block of the library of circuit building blocks based upon respective packing compatibilities, wherein a cluster includes at least one pair of circuit building blocks interlocked with one another at an interlocking boundary.

11. The method of item 10, further comprising:
 defining a packing optimization variable for the at least one pair of interlocked circuit building blocks of one or more clusters.

12. The method of item 11, wherein the packing optimization variable includes (i) a value of unity in response to the at least one pair of interlocked circuit building blocks of a given cluster having a packing compaction of one hundred percent (100%) at the interlocking boundary or (ii) a value less than unity in response to the at least one pair of interlocked circuit building blocks having a packing compaction of less than one hundred percent (100%) at the interlocking boundary.

13. The method of item 12, further comprising:
 storing the formed clusters in the library;
 selecting a cluster from among the formed clusters; and
 determining whether an opportunity exists for optimizing a packing compaction of the selected cluster, wherein responsive to a determination that opportunity exists, then (a)(i) forming a new cluster using (a)(i)(1) at least one of the circuit building blocks of the selected cluster and (a)(i)(2) another circuit building block from the library or another cluster of the formed clusters and (a)(ii) repeating the determining step for the new cluster, otherwise (b) identifying the cluster as optimized, storing the optimized cluster in the library, proceeding with the selection of another cluster from among the formed clusters, and repeating the determining step until a desired percentage of clusters in the library have been optimized.

14. The method of item 13, wherein prior to determining physical extent boundaries for each layer of the first circuit building block, the second circuit building block, or another circuit building block, the method further comprising:
 categorizing the first, second, and another circuit building blocks into categories according to circuit functionalities and connections in the circuit diagram or netlist and
 performing for each category, the steps of determining physical extent boundaries, establishing packing keys, forming clusters, defining packing optimization variables, and optimizing.

15. The method of item 13, further comprising:
 determining the location of buffers in the integrated circuit layout design based upon where the cluster comprising the buffer best interlocks with a neighboring blocks in the same path in the integrated circuit layout.

16. The method of item 13, further comprising:
 placing and routing circuit building blocks and clusters in a 3-dimensional integrated circuit design.

17. The method of item 16, further comprising:
 quantizing a block size for the 3-dimensional integrated circuit design that includes at least various circuit building blocks and optimized clusters; and
 adding tile regions among the various circuit building blocks and optimized clusters to fill in a difference between (i) an actual size of the various circuit building blocks and optimized clusters and (ii) the quantized block size, wherein the added tile regions are adapted to create regularity within the quantized 3-dimensional integrated circuit design.

18. The method of item 17, wherein the quantized 3-dimensional integrated circuit design comprises a back-end-of-line (BEOL) only region of the 3-dimensional integrated circuit design.

19. A method of area compaction for integrated circuit layout design comprising:
 determining physical extent boundaries for each layer of at least first circuit and second circuit building blocks, wherein determining physical extent boundaries includes determining for each respective layer of the first circuit and second circuit building blocks (i) a used portion and (ii) a free portion, the used portion corresponding to a functional portion of the respective circuit building block and the free portion corresponding to a non-functional portion of the respective circuit building block; and
 establishing packing keys with respect to the determined physical extent boundaries of each layer of the first circuit and second circuit building blocks, respectively, wherein the packing keys define an interlocking characteristic for packing compaction of the corresponding first circuit or second circuit building block with another circuit building block.

20. The method of item 19, further comprising:
 determining packing compatibilities of one or more pairs of circuit building blocks of a library of circuit building blocks, wherein the packing compatibility for a given pair of circuit building blocks is determined according to respective packing keys of each circuit building block of the given pair of circuit building blocks; and
 forming clusters between two or more of the first circuit building block, the second circuit building block, and another circuit building block of the library of circuit building blocks based upon respective packing compatibilities, wherein a cluster includes at least one pair of circuit building blocks interlocked with one another at an interlocking boundary.

21. A method of area compaction for integrated circuit layout design comprising:

determining physical extent boundaries for each layer of at least first circuit and second circuit building blocks, wherein determining physical extent boundaries includes determining for each respective layer of the first circuit and second circuit building blocks (i) a used portion and (ii) a free portion, the used portion corresponding to a functional portion of the respective circuit building block and the free portion corresponding to a non-functional portion of the respective circuit building block;

establishing packing keys with respect to the determined physical extent boundaries of each layer of the first circuit and second circuit building blocks, respectively, wherein the packing keys define an interlocking characteristic for packing compaction of the corresponding first circuit or second circuit building block with another circuit building block;

determining packing compatibilities of one or more pairs of circuit building blocks of a library of circuit building blocks, wherein the packing compatibility for a given pair of circuit building blocks is determined according to respective packing keys of each circuit building block of the given pair of circuit building blocks;

forming clusters between two or more of the first circuit building block, the second circuit building block, and another circuit building block of the library of circuit building blocks based upon respective packing compatibilities, wherein a cluster includes at least one pair of circuit building blocks interlocked with one another at an interlocking boundary;

defining a packing optimization variable for the at least one pair of interlocked circuit building blocks of one or more clusters, wherein the packing optimization variable includes (i) a value of unity in response to the at least one pair of interlocked circuit building blocks of a given cluster having a packing compaction of one hundred percent (100%) at the interlocking boundary or (ii) a value less than unity in response to the at least one pair of interlocked circuit building blocks having a packing compaction of less than one hundred percent (100%) at the interlocking boundary;

storing the formed clusters in the library;

selecting a cluster from among the formed clusters;

determining whether an opportunity exists for optimizing a packing compaction of the selected cluster, wherein responsive to a determination that opportunity exists, then (a)(i) forming a new cluster using (a)(i)(1) at least one of the circuit building blocks of the selected cluster and (a)(i)(2) another circuit building block from the library or another cluster of the formed clusters and (a)(ii) repeating the determining step for the new cluster, otherwise (b) identifying the cluster as optimized, storing the optimized cluster in the library, proceeding with the selection of another cluster from among the formed clusters, and repeating the determining step until a desired percentage of clusters in the library have been optimized;

placing and routing circuit building blocks and clusters in a 3-dimensional integrated circuit design;

quantizing a block size for the 3-dimensional integrated circuit design that includes at least various circuit building blocks and optimized clusters; and adding tile regions among the various circuit building blocks and optimized clusters to fill in a difference between (i) an actual size of the various circuit building blocks and optimized clusters and (ii) the quantized block size, wherein the added tile regions are adapted to create regularity within the quantized 3-dimensional integrated circuit design.

By now it should be appreciated that there has been provided a method for interconnecting blocks, tiles, or other features to define non-rectangular or interlocking clusters. This method enable compaction in levels that have reduced area efficiently (e.g., a design having an FEOL intensive first metal layer and a sparse second metal layer with a design having a BEOL intensive second metal layer and a sparse FEOL intensive first metal layer.) Each block may have a flag associated with it to identify a z-direction usage. The method may include grouping, packing, and densification processes. In one embodiment, the method may include an analysis of cluster usage and proximity analysis to establish the opportunity for combining clusters together to reduce area. In one embodiment, the optimization of clusters may include mirror rotations or other forms of rotation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, area compaction may be useful in designing opto-electronic circuits that include non-semiconducting optical elements with curved layout boundaries or 3D interconnect structures including multiple stacked layers and active regions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of area compaction for integrated circuit layout design comprising:
   determining physical extent boundaries for each layer of a first circuit building block;
   establishing a first packing key with respect to the determined physical extent boundaries of each layer of the first circuit building block, wherein the packing key defines an interlocking characteristic for packing compaction with another circuit building block;
   determining physical extent boundaries for each layer of a second circuit building block; and
   establishing a second packing key with respect to the determined physical extent boundaries of each layer of the second circuit building block, wherein the second packing key defines an interlocking characteristic for packing compaction with the first circuit building block or another circuit building block;
   determining packing compatibilities of one or more pairs of circuit building blocks of a library of circuit building blocks, wherein the packing compatibility for a given pair of circuit building blocks is determined according to respective packing keys of each circuit building block of the given pair of circuit building blocks;
   defining using a computer, a packing optimization variable for the at least one pair of interlocked circuit building blocks of one or more clusters, wherein the packing optimization variable includes (i) a value of unity in response to the at least one pair of interlocked circuit building blocks of a given cluster having a packing compaction of one hundred percent (100%) at the interlocking boundary or (ii) a value less than unity in response to the at least one pair of interlocked circuit building blocks having a packing compaction of less than one hundred percent (100%) at the interlocking boundary; and
   forming clusters between two or more of the first circuit building block, the second circuit building block, and another circuit building block of the library of circuit building blocks based upon respective packing compatibilities, wherein a cluster includes at least one pair of circuit building blocks interlocked with one another at an interlocking boundary.

2. The method of claim 1, wherein determining physical extent boundaries includes determining for each layer of the first circuit building block (i) a used portion and (ii) a free portion, the used portion corresponding to a functional portion of the first circuit building block and the free portion corresponding to a non-functional portion of the first circuit building block.

3. The method of claim 2, wherein the functional portion comprises a portion functionally used by the first circuit building block and the non-functional portion comprises a portion not functionally used by the first circuit building block.

4. The method of claim 1, wherein determining physical extent boundaries includes determining for each layer of the first circuit building block (i) an area for active usage by the first circuit building block and (ii) an area free of active usage.

5. The method of claim 1, wherein determining physical extent boundaries includes analyzing a first circuit building block in terms of area usage for a characteristic selected from the group consisting of (i) at least one FEOL device layer and (ii) at least one BEOL routing layer of the first circuit building block.

6. The method of claim 1, wherein the interlocking characteristic of the first packing key includes a non-rectangular shape in cross-section for use in a packing compaction.

7. The method of claim 1, wherein determining physical extent boundaries includes analyzing the second circuit building block in terms of area usage for a characteristic selected from the group consisting of (i) at least one FEOL device layer and (ii) at least one BEOL routing layer of the second circuit building block.

8. The method of claim 1, further comprising:
   storing the formed clusters in the library;
   selecting a cluster from among the formed clusters; and
   determining whether an opportunity exists for optimizing a packing compaction of the selected cluster, wherein responsive to a determination that opportunity exists, then (a)(i) forming a new cluster using (a)(i)(1) at least one of the circuit building blocks of the selected cluster and (a)(i)(2) another circuit building block from the library or another cluster of the formed clusters and (a)(ii) repeating the determining step for the new cluster, otherwise (b) identifying the cluster as optimized, storing the optimized cluster in the library, proceeding with the selection of another cluster from among the formed clusters, and repeating the determining step until a desired percentage of clusters in the library have been optimized.

9. The method of claim 8, wherein prior to determining physical extent boundaries for each layer of the first circuit building block, the second circuit building block, or another circuit building block, the method further comprising:
   categorizing the first, second, and another circuit building blocks into categories according to circuit functionalities and connections in the circuit diagram or netlist and
   performing for each category, the steps of determining physical extent boundaries, establishing packing keys, forming clusters, defining packing optimization variables, and optimizing.

10. The method of claim 8, further comprising:
    placing and routing circuit building blocks and clusters in a 3-dimensional integrated circuit design.

11. The method of claim 10, further comprising:
    quantizing a block size for the 3-dimensional integrated circuit design that includes at least various circuit building blocks and optimized clusters; and
    adding tile regions among the various circuit building blocks and optimized clusters to fill in a difference between (i) an actual size of the various circuit building blocks and optimized clusters and (ii) the quantized block size, wherein the added tile regions are adapted to create regularity within the quantized 3-dimensional integrated circuit design.

12. The method of claim 11, wherein the quantized 3-dimensional integrated circuit design comprises a back-end-of-line (BEOL) only region of the 3-dimensional integrated circuit design.

13. The method of claim 8, further comprising:
determining the location of buffers in the integrated circuit layout design based upon where the cluster comprising the buffer best interlocks with a neighboring blocks in the same path in the integrated circuit layout.

14. A method of area compaction for integrated circuit layout design comprising:
determining physical extent boundaries for each layer of at least first circuit and second circuit building blocks, wherein determining physical extent boundaries includes determining for each respective layer of the first circuit and second circuit building blocks (i) a used portion and (ii) a free portion, the used portion corresponding to a functional portion of the respective circuit building block and the free portion corresponding to a non-functional portion of the respective circuit building block;
establishing packing keys with respect to the determined physical extent boundaries of each layer of the first circuit and second circuit building blocks, respectively, wherein the packing keys define an interlocking characteristic for packing compaction of the corresponding first circuit or second circuit building block with another circuit building block;
determining packing compatibilities of one or more pairs of circuit building blocks of a library of circuit building blocks, wherein the packing compatibility for a given pair of circuit building blocks is determined according to respective packing keys of each circuit building block of the given pair of circuit building blocks;
forming clusters between two or more of the first circuit building block, the second circuit building block, and another circuit building block of the library of circuit building blocks based upon respective packing compatibilities, wherein a cluster includes at least one pair of circuit building blocks interlocked with one another at an interlocking boundary;
defining using a computer, a packing optimization variable for the at least one pair of interlocked circuit building blocks of one or more clusters, wherein the packing optimization variable includes (i) a value of unity in response to the at least one pair of interlocked circuit building blocks of a given cluster having a packing compaction of one hundred percent (100%) at the interlocking boundary or (ii) a value less than unity in response to the at least one pair of interlocked circuit building blocks having a packing compaction of less than one hundred percent (100%) at the interlocking boundary;
storing the formed clusters in the library;
selecting a cluster from among the formed clusters;
determining whether an opportunity exists for optimizing a packing compaction of the selected cluster, wherein responsive to a determination that opportunity exists, then (a)(i) forming a new cluster using (a)(i)(1) at least one of the circuit building blocks of the selected cluster and (a)(i)(2) another circuit building block from the library or another cluster of the formed clusters and (a)(ii) repeating the determining step for the new cluster, otherwise (b) identifying the cluster as optimized, storing the optimized cluster in the library, proceeding with the selection of another cluster from among the formed clusters, and repeating the determining step until a desired percentage of clusters in the library have been optimized;
placing and routing circuit building blocks and clusters in a 3-dimensional integrated circuit design;
quantizing a block size for the 3-dimensional integrated circuit design that includes at least various circuit building blocks and optimized clusters; and
adding tile regions among the various circuit building blocks and optimized clusters to fill in a difference between (i) an actual size of the various circuit building blocks and optimized clusters and (ii) the quantized block size, wherein the added tile regions are adapted to create regularity within the quantized 3-dimensional integrated circuit design.

\* \* \* \* \*